(12) United States Patent
Homyk et al.

(10) Patent No.: US 8,809,093 B2
(45) Date of Patent: Aug. 19, 2014

(54) METHODS FOR FABRICATING SELF-ALIGNING SEMICONDUTOR HETEROSTRUCTURES USING SILICON NANOWIRES

(75) Inventors: Andrew P. Homyk, South Pasadena, CA (US); Michael D. Henry, Albuquerque, NM (US); Axel Scherer, Woodstock, VT (US); Sameer Walavalkar, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 167 days.

(21) Appl. No.: 12/949,758

(22) Filed: Nov. 18, 2010

(65) Prior Publication Data

US 2011/0140085 A1 Jun. 16, 2011

Related U.S. Application Data

(60) Provisional application No. 61/262,843, filed on Nov. 19, 2009.

(51) Int. Cl.
| | |
|---|---|
| *H01L 21/20* | (2006.01) |
| *B82Y 10/00* | (2011.01) |
| *H01L 29/06* | (2006.01) |
| *H01L 29/775* | (2006.01) |
| *H01L 29/66* | (2006.01) |

(52) U.S. Cl.
CPC ............. *H01L 29/0665* (2013.01); *B82Y 10/00* (2013.01); *H01L 29/0676* (2013.01); *H01L 29/775* (2013.01); *H01L 29/66439* (2013.01); *Y10S 977/762* (2013.01)

USPC ................ 438/47; 438/692; 977/762; 257/94

(58) Field of Classification Search
USPC ............ 977/938, 763–765, 762, 774; 257/94; 438/47

See application file for complete search history.

(56) References Cited

U.S. PATENT DOCUMENTS

| | | | | |
|---|---|---|---|---|
| 4,322,571 | A * | 3/1982 | Stanbery | 136/255 |
| 6,586,787 | B1 * | 7/2003 | Shih et al. | 257/288 |
| 6,593,065 | B2 | 7/2003 | Scherer | |
| 6,831,017 | B1 * | 12/2004 | Li et al. | 438/694 |
| 7,302,146 | B2 | 11/2007 | Turner et al. | |
| 7,387,967 | B2 | 6/2008 | Ogawa et al. | |
| 7,419,908 | B2 | 9/2008 | Green | |
| 7,622,394 | B2 | 11/2009 | Ikegami | |

(Continued)

FOREIGN PATENT DOCUMENTS

| | | |
|---|---|---|
| JP | 2004193525 | 7/2004 |
| JP | 2007194646 | 8/2007 |
| JP | 2008130712 | 6/2008 |
| WO | 2007077842 | 7/2007 |

OTHER PUBLICATIONS

Non-Final Office Action issued for U.S. Appl. No. 12/712,097, filed Feb. 24, 2010 in the name of Michael D. Henry et al. mail date: Jul. 30, 2012.

(Continued)

*Primary Examiner* — Fernando L Toledo
*Assistant Examiner* — Peter Bradford
(74) *Attorney, Agent, or Firm* — Steinfl & Bruno LLP

(57) ABSTRACT

Methods for fabricating self-aligned heterostructures and semiconductor arrangements using silicon nanowires are described.

5 Claims, 6 Drawing Sheets

(56) References Cited

U.S. PATENT DOCUMENTS

| | | | |
|---|---|---|---|
| 7,947,430 B2 | 5/2011 | Fu et al. | |
| 8,067,763 B2* | 11/2011 | Wang et al. | 257/40 |
| 8,080,468 B2 | 12/2011 | Scherer et al. | |
| 8,557,612 B2 | 10/2013 | Henry et al. | |
| 8,557,613 B2 | 10/2013 | Shearn et al. | |
| 8,569,741 B2 | 10/2013 | Scherer et al. | |
| 2002/0127495 A1 | 9/2002 | Scherer | |
| 2004/0071951 A1 | 4/2004 | Jin | |
| 2004/0108298 A1 | 6/2004 | Gao | |
| 2005/0279989 A1* | 12/2005 | Li et al. | 257/13 |
| 2006/0063368 A1 | 3/2006 | Sharma | |
| 2006/0088995 A1 | 4/2006 | Zhang et al. | |
| 2006/0118975 A1 | 6/2006 | Koenenkamp | |
| 2006/0131695 A1* | 6/2006 | Kuekes et al. | 257/618 |
| 2006/0207647 A1* | 9/2006 | Tsakalakos et al. | 136/256 |
| 2006/0223324 A1 | 10/2006 | Ikegami | |
| 2007/0126079 A1 | 6/2007 | Shioya et al. | |
| 2007/0132043 A1 | 6/2007 | Bradley et al. | |
| 2008/0009121 A1* | 1/2008 | Wei | 438/406 |
| 2008/0035983 A1 | 2/2008 | Sandhu et al. | |
| 2008/0036038 A1 | 2/2008 | Hersee et al. | |
| 2008/0092938 A1* | 4/2008 | Majumdar et al. | 136/200 |
| 2008/0102319 A1* | 5/2008 | Bratkovski et al. | 428/824 |
| 2008/0142970 A1* | 6/2008 | Evans et al. | 257/741 |
| 2008/0149944 A1* | 6/2008 | Samuelson et al. | 257/88 |
| 2008/0156369 A1 | 7/2008 | Ko et al. | |
| 2008/0203431 A1 | 8/2008 | Bonaventura et al. | |
| 2008/0211040 A1 | 9/2008 | Lieber et al. | |
| 2008/0230802 A1 | 9/2008 | Bakkers et al. | |
| 2009/0203214 A1* | 8/2009 | Hurkx et al. | 438/692 |
| 2010/0006817 A1* | 1/2010 | Ohlsson et al. | 257/13 |
| 2010/0019355 A1* | 1/2010 | Kamins et al. | 257/627 |
| 2010/0033561 A1* | 2/2010 | Hersee | 348/80 |
| 2010/0065941 A1 | 3/2010 | Wells et al. | |
| 2010/0068828 A1* | 3/2010 | Thomas et al. | 438/3 |
| 2010/0176822 A1 | 7/2010 | Offermans et al. | |
| 2010/0213579 A1 | 8/2010 | Henry et al. | |
| 2010/0215543 A1 | 8/2010 | Henry et al. | |
| 2010/0291385 A1 | 11/2010 | Greer et al. | |
| 2011/0020960 A1 | 1/2011 | Henry et al. | |
| 2011/0031470 A1 | 2/2011 | Scherer et al. | |
| 2011/0165724 A1* | 7/2011 | Guha et al. | 438/71 |

OTHER PUBLICATIONS

PCT International Search Report issued for PCT/US2010/057301 filed Nov. 18, 2010 in the name of California Institute of Technology et al.
PCT Written Opinion issued for PCT/US2010/057301 filed Nov. 18, 2010 in the name of California Institute of Technology et al.
Non-Final Office Action issued for U.S. Appl. No. 12/711,992, filed Feb. 24, 2010 in the name of Michael D. Henry et al. mail date: Oct. 17, 2011.
Restriction Requirement issued for U.S. Appl. No. 12/712,097, filed Feb. 24, 2010 in the name of Michael D. Henry et al. mail date: Jul. 13, 2011.
Non-Final Office Action issued for U.S. Appl. No. 12/712,097, filed Feb. 24, 2010 in the name of Michael D. Henry et al. mail date: Oct. 7, 2011.
Restriction Requirement issued for U.S. Appl. No. 12/822,109, filed Jun. 23, 2010 in the name of Axel Scherer et al. mail date: Mar. 30, 2011.
Notice of Allowance issued for U.S. Appl. No. 12/822,109, filed Jun. 23, 2010 in the name of Axel Scherer et al. mail date: May 23, 2011.
Notice of Allowance issued for U.S. Appl. No. 12/822,109, filed Jun. 23, 2010 in the name of Axel Scherer et al. mail date: Sep. 12, 2011.
Notice of Allowance issued for U.S. Appl. No. 12/711,992, filed Feb. 24, 2010 in the name of Michael D. Henry et al. mail date: Jan. 27, 2012.
PCT International Search Report issued for PCT Application No. PCT/US2010/025256 filed on Feb. 24, 2010 in the name of California Institute of Technology et al.
PCT Written Opinion issued for PCT Application No. PCT/US2010/025256 filed on Feb. 24, 2010 in the name of California Institute of Technology et al.
PCT International Search Report issued for PCT Application No. PCT/US2010/025261 filed on Feb. 24, 2010 in the name of California Institute of Technology et al.
PCT Written Opinion issued for PCT Application No. PCT/US2010/025261 filed on Feb. 24, 2010 in the name of California Institute of Technology et al.
PCT International Search Report issued for PCT Application No. PCT/US2010/039702 filed on Jun. 23, 2010 in the name of California Institute of Technology et al.
PCT Written Opinion issued for PCT Application No. PCT/US2010/039702 filed on Jun. 23, 2010 in the name of California Institute of Technology et al.
Teh, W., et al., Cross-linked PMMA as a low Dimensional Sacrificial Layer, Journal of Electromechanical Systems 2003, 12: 641-648.
Zeiler, I., et al., Crosslinked PMMA as a High-resolution Negative Resist for Electron Beam Lithography and Applications for Physics of Low-dimensional Structures, Semiconductor Sci. Technol. 1996, 11: 1235-1238.
Hon, K., et al., Periodically Poled Silicon, Applied Physics Letters 2009, 94: 091116-1-091116-3.
Kayes, B.M., et al., Comparison of the Device Physics Principles of p-n. Junction Nanorod Solar Cells, Journal of Applied Physics 2005, 97: 114302-1-114302-11.
Singh, N., et al., High-Performance Fully Depleted Silicon Nanowire (Diameter $\leq$ 5 nm) Gate-All-Around CMOS Devices, IEEE Electron Device Letters 2006, 27:383-386.
Sainiemi, L., et al., Rapid Fabrication of High Aspect Ratio Silicon Nanopillars for Chemical Analysis, Nanotechnology 2007, 18: 505303-1-505303-7.
Moser, B., et al., Strength and Fracture of Si Micropillars: A new scanning electron microscopy-based micro-compression test, Journal of Material Resources 2007, 22: 1004-1011.
Sajjad, R., et al., Electronic Properties of a Strained <100> Silicon Nanowire, Journal of Applied Physics 2009, 105: 044307-1-044307-6.
Kelzenberg, M.D., et al., Single-nanowire Si Solar Cells, pp. 1-6.
Rangelow, I.W., et al., Critical Tasks in High Aspect Ratio Silicon Dry Etching for Microelectromechanical Systems, Journal of Vacuum Science Technology A 2003, 21: 1550-1562.
de Boer, M., et al., Guidelines for Etching Silicon MEMS Structures Using Fluorine High-density Plasmas at Cryogenic Temperatures, Journal of Microelectromechanical Systems 2002, 11: 385-401.
Welch, C.C., et al., Silicon Etch Process Options for Micro- and Nanotechnology Using Inductively Coupled Plasmas, Microelectronic Engineering 2006, 83: 1170-1173.
Sainiemi, L., et al., Mask Material Effects in Cryogenic Deep Reactive Ion Etching, Journal of Vacuum Science Technology B 2007, 25: 801-807.
Williams, K.R., et al., Etch Rates for Micromachining Processing—Part II, Journal of Microelectromechanical Systems 2003, 12: 761-778.
Yeom, J., et al., Maximum Achievable Aspect Ratio in Deep Reactive Ion Etching of Silicon due to Aspect Ratio Dependent Transport and the Microloading Effect, Journal of Vacuum Science Technology 2005, 23: 2319-2329.
Scheible, D., et al., Silicon Nanopillars for Mechanical Single-electron Transport, Applied Physics Letters 2004, 84: 4632-4634.
Kim, H., et al., Field Emission From a Single Nanomechanical Pillar, Nanotechnology 2007, 18: 065201-1-065201-4.
Lauhon, L., et al., Epitaxial Core-shell and Core-multishell Nanowire Heterostructures, Nature 2002, 420: 57-61.
Nassiopoulos, A., et al., Electroluminescent Device Based on Silicon Nanopillars, Applied Physics Letters 1996, 69: 2267-2269.
Photopoulos, P., et al., Photoluminescence from Nanocrystalline Silicon in Si/SiO2 Superlattices, Applied Physics Letters 2000, 76: 3588-3590.
Bogglid, P., et al., Fabrication and Actuation of Customized Nanotweezers with a 25 nm Gap, Nanotechnology 2001, 12: 331-335.

(56) References Cited

OTHER PUBLICATIONS

Tang, Z., et al., Finite Temperature Quasicontinuum Method for Multiscale Analysis of Silicon Nanostructures, Physical Review 2006, 74: 064110-1-064110-16.
Singh, J., Electronic and Optoelectronic Properties of Semiconductor Structures, In Electronic and Optoelectronic Properties of Semiconductor Structures, 2003, Cambridge University Press, Chapter 1.4 Strained heterostructures, 26-31.
Hashemi, P., et al., Asymmetric Strain in Nanoscale Patterned Strained-Si/strained-Ge/strained-Si Heterostructures on Insulator, Applied Physics Letters 2007, 91: 083109-1-083109-3.
Jacobsen, R., et al., Strained Silicon as a New Electro-optic Material, Nature 2006, 441: 199-202.
Timoshenko, S., Analysis of Bi-metal Thermostats, Journal of the Optical Society of America 1925, 11: 233-255.
Chang, Y.-F., et al., Fabrication of high-aspect-ratio silicon nanopillar arrays with the conventional reactive ion etching technique, Applied Physics A 2007, 86: 193-196.
Plasmalab Data Sheet, Si etching for MEMS, www.oxfordplasma.de/process/sibo_2.htm, Jan. 2002.
Henry, M., et al., Alumina Etch Masks for Fabrication of High-Aspect Ratio Silicon Micropillars and Nanopillars, Nanotechnology 2009, 20: 255305-1-255305-4.
Wiener, H., Vapor Pressure-Temperature Relationships Among the Branched Paraffin Hydrocarbons, ACS 1948, 425-430.
Chirico, R., et al., Vapor Pressure of n-Alkanes Revisted. New High-Precision Vapor Data on n-Decane, n-Elcosane and n-Octacosane, J. Chem. Eng. Data 1989, 34: 149-156.
Ambrose, D., et al., Vapor Pressures up to their critical temperatures of normal alkanes and 1-alkanols, Pure & Appl. Chem. 1989, 61: 1395-1403.
Ebron, V., et al., Fuel-Powered Artificial Muscles, Science 2006, 311: 1580-1582.
Cassie, A., et al., Wettability of Porous Surfaces, Trans. of Faraday Soc. 1944, 40: 346-351.
Gao, L., et al., The "lotus effect" Explained: Two Reasons why two length scales of topography are important, Langmuir 2006, 22: 2966-2967.
Li, H., et al., Investigation of Capacitive Humidity Sensing Behavior of Silicon Nanowires, Physica E 2009, 41: 600-604.
Kuan, W., et al., The Preparation of Superhydrophobic Surfaces of Hierarchical Silicon Nanowire Structures, Nanotechnology 2009, 20: 035605-1-035605-8.
Barrett, C.S., et al., Lattice Constants of Gallium at 297 K, Nature 1965, 207: 1382.
Chekurov, N., et al., The Fabrication of Silicon Nanostructures by Local Gallium Implantation and Cryogenic Deep Reactive Ion Etching, Nanotechnology 2009, 20: 065307-1-065307-5.
Frey, L., et al., Nanoscale Effects in Focused Ion Beam Processing, Applied Physics A: Materials Science & Processing 2003, 76: 1017-1023.
Gates, B., et al., New Approaches to Nanofabrication: Molding, Printing, and Other Techniques, Chemical Reviews 2005, 105: 1171-1196.
Gierak, J., et al., Exploration of the Ultimate Patterning Potential Achievable with High Resolution Focused Ion Beams, Applied Physics A: Materials Science & Processing 2005, 80: 187-194.
Jansen, H.V., et al., Black Silicon Method X: A Review on High Speed and Selective Plasma Etching of Silicon with Profile Control: An In-Depth Comparison Between Bosch and Cryostat DRIE Processes as a Roadmap to Next Generation Equipment, Journal of Micromechanics and Microengineering 2009, 19: 033001-1-033001-41.
Kato, N.I., et al., Side-wall Damage in a Transmission Electron Microscopy Specimen of Crystalline Si Prepared by Focused Ion Beam Etching, Journal of Vacuum Science Technology A 1999, 17: 1201-1024.
Marrian, C., et al., Nanofabrication, Journal of Vacuum Science Technology A 2003, 21: S207-S215.

Melngailis, J., et al., A Review of Ion Projection Lithography, Journal of Vacuum Science Technology B 1998, 16: 927-957.
Mosher, L., et al., Double-Exposure Grayscale Photolithography, Journal of Microelectromechanical Systems 2009, 18: 308-315.
Qian, H.X., et al., Fabrication of Si Microstructures Using Focused Ion Beam Implantation and Reactive Ion Etching, Journal of Micromechanics and Microengineering 2008, 18: 035003-1-035003-5.
Schmidt, B., et al., Writing FIB Implantation and Subsequent Anisotropic Wet Chemical Etching for Fabrication of 3D Structures in Silicon, Sensors and Actuators A: Physical 1997, 61: 369-373.
Schmidt, B., et al., Etch Rate Retardation of $Ga^+$-Ion Beam-Irradiated Silicon, Journal of the Electrochemical Society 2005, 152: G875-G879.
Sunkara, M.K., et al., Bulk Synthesis of Silicon Nanowires Using a Low-Temperature Vapor-Liquid-Solid Method, Applied Physics Letters 2001, 79: 1546-1548.
Tseng, A., Recent Developments in Micromilling Using Focused Ion Beam Technology, Journal of Micromechanics and Microengineering 2004, 14: R15-R34.
Tseng, A., Recent Developments in Nanofabrication Using Ion Projection Lithography, Small 2005, 1: 594-608.
Tseng, A., Milling of Submicron Channels on Gold Layer Using Double Charged Arsenic Ion Beam, Journal of Vacuum Science & Technology B: Microelectronics and Nanostructures 2004, 22: 82-89.
Watt, F., et al., Ion Beam Lithography and Nanofabrication: A Review, International Journal of Nanoscience 2005, 4: 269-286.
Zhou, Z., et al., Two-Beam-Current Method for E-Beam Writing Gray-Scale Masks and Its Application to High-Resolution Microstructures, Applied Optics 2008, 47: 3177-3184.
Non-Final Office Action for U.S. Appl. No. 12/952,181, filed Nov. 22, 2010 in the name of Andrew P. Homyk et al. Mail Date: Oct. 24, 2012.
Restriction Requirement for U.S. Appl. No. 12/712,097, filed Feb. 24, 2010 in the name of Michael Henry et al. Mail Date: May 1, 2012.
Final Office Action for U.S. Appl. No. 12/712,097, filed Feb. 24, 2010 in the name of Michael Henry et al. Mail Date: Jul. 30, 2012.
Advisory Action for U.S. Appl. No. 12/712,097, filed Feb. 24, 2010 in the name of Michael Henry et al. Mail Date: Nov. 2, 2012.
(Second) Advisory Action for U.S. Appl. No. 12/712,097, filed Feb. 24, 2010 in the name of Michael Henry et al. Mail Date: Dec. 6, 2012.
Advisory Action mailed on Nov. 2, 2012 for U.S. Appl. No. 12/712,097, filed Feb. 24, 2010 in the name of Michael D. Henry et al.
Non-Final Office Action mailed on Oct. 24, 2012 for U.S. Appl. No. 12/952,181, filed Nov. 22, 2010 in the name of Andrew P. Homyk et al.
Non-Final Office Action mailed on May 7, 2013 for U.S. Appl. No. 13/286,008, filed Oct. 31, 2011 in the name of Walavalkar et al.
Notice of Allowance mailed on Aug. 12, 2013 for U.S. Appl. No. 13/286,008, filed Oct. 31, 2011 in the name of Walavalkar et al.
Final Office Action mailed on Mar. 19, 2013 for U.S. Appl. No. 12/952,181, filed Nov. 22, 2010 in the name of Homyk et al.
Non-Final Office Action mailed on Jul. 23, 2013 for U.S. Appl. No. 12/952,181, filed Nov. 22, 2010 in the name of Homyk et al.
Restriction Requirement mailed on Oct. 17, 2012 for U.S. Appl. No. 12/824,128, filed Jun. 25, 2010 in the name of Michael D. Henry et al.
Notice of Allowance mailed on Jan. 11, 2013 for U.S. Appl. No. 12/824,128, filed Jun. 25, 2010 in the name of Michael D. Henry et al.
Notice of Allowance mailed on Apr. 2, 2013 for U.S. Appl. No. 12/824,128, filed Jun. 25, 2010 in the name of Michael D. Henry et al.
Notice of Allowance mailed on Aug. 6, 2013 for U.S. Appl. No. 12/824,128, filed Jun. 25, 2010 in the name of Michael D. Henry et al.
Restriction Requirement mailed on Jan. 10, 2013 for U.S. Appl. No. 13/159,335, filed Jun. 13, 2011 in the name of Michael Shearn et al.
Non-Final Office Action mailed on Mar. 2, 2013 for U.S. Appl. No. 13/159,335, filed Jun. 13, 2011 in the name of Michael Shearn et al.
Notice of Allowance mailed on Sep. 20, 2013 for U.S. Appl. No. 13/159,335, filed Jun. 13, 2011 in the name of Michael Shearn et al.
Eichenfield, M., et al., Optomechanical crystals, Nature 2009, 462: pp. 78-2.
Ekinci, KL, et al., Nanoelectromechanical systems, Review of Scientific Instruments 2005, 76: 061101-1-061101-12.

(56) References Cited

OTHER PUBLICATIONS

Henry, MD et al., Ga+ beam lithography for nanoscale silicon reactive ion etching, Nanotechnology 2010, 21, pp. 1-8.

Hoshikawa, T . et al., Relationship between Gallium Concentration and Resistivity of Gallium-Doped Czochralski Silicon Crystals: Investigation of a Conversion Curve, Japanese J. Appl. Phys. 2008, 47: pp. 8691-8695.

Lugstein, A. et al., FIB processing of silicon in the nanoscale regime, Appl. Phys. A 2003, 76: 545-548.

Mellhaoui, X. et al., SiOxFy passivation layer in silicon cryoetching, J. Appl. Phys. 2005, 98: 104901-1-104901-10.

Olesinski, RW et al., The Ga-Si (Gallium-Silicon) System, Bulletin of the Alloy Phase Diagrams 1985, 6: 362-364.

Sievila, P. et al., The fabrication of silicon nanostructures by focused-ion-beam implantation and TMAH wet etching, Nanotechnology 2010, 21: 145301-1-145301-6.

Tachi, S. et al., Low-temperature reactive ion etching and microwave plasma etching of silicon, Appl. Phys. Letters 1988, 52: 616-618.

\* cited by examiner

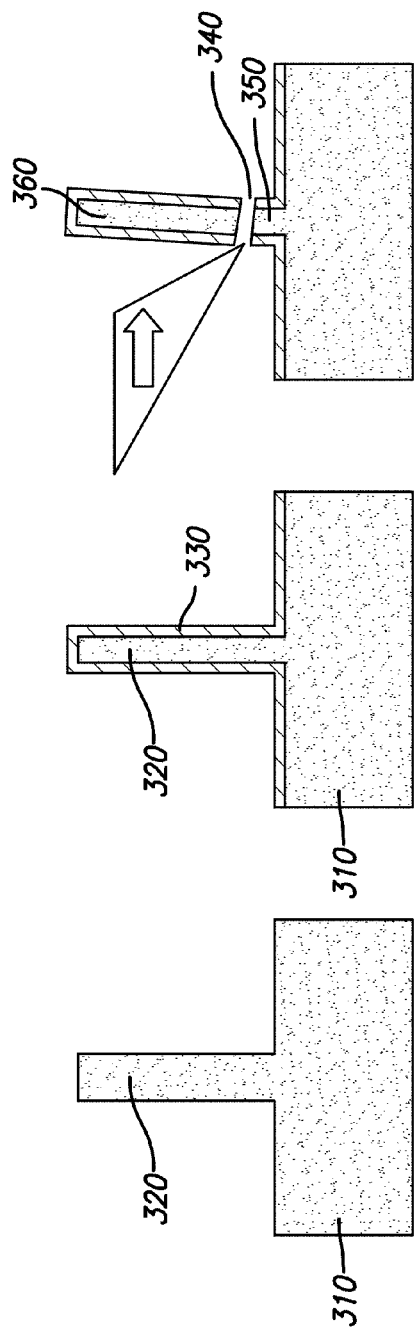
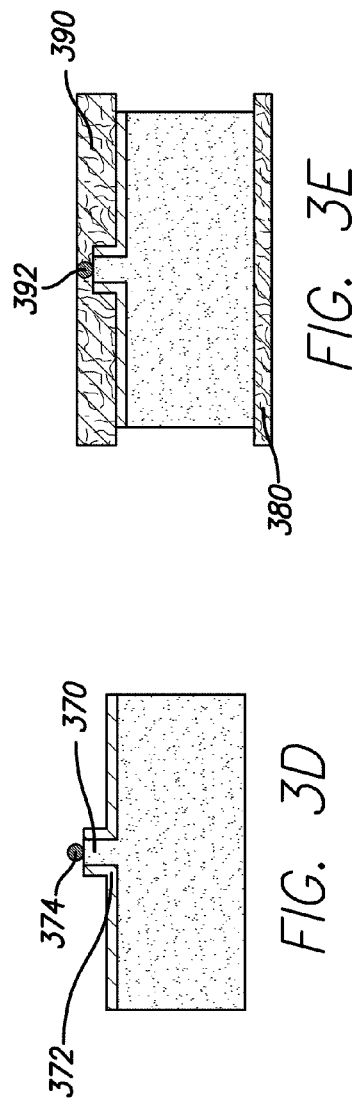

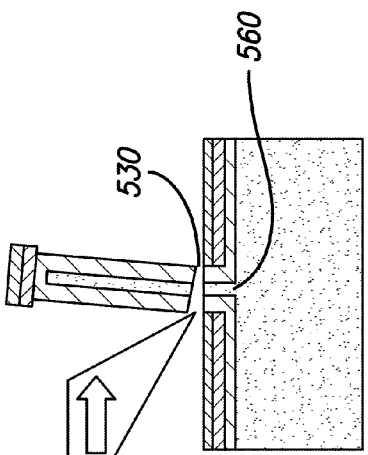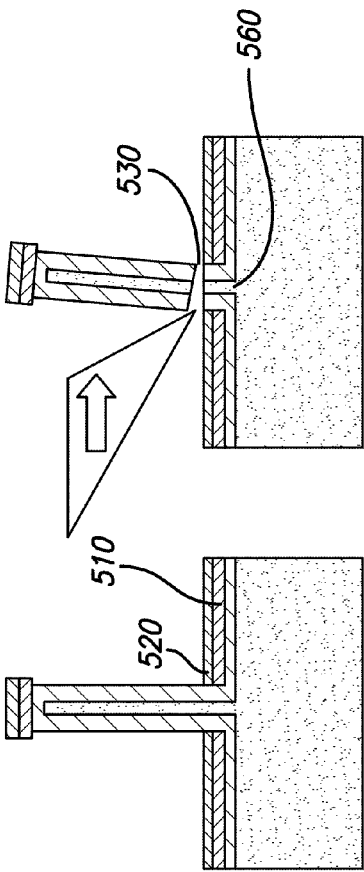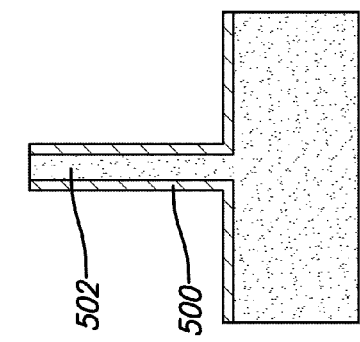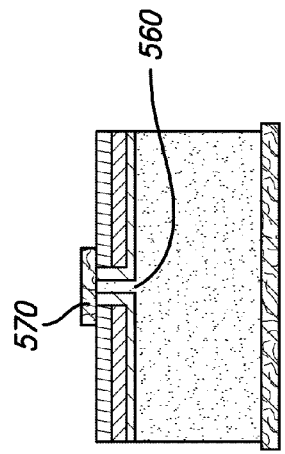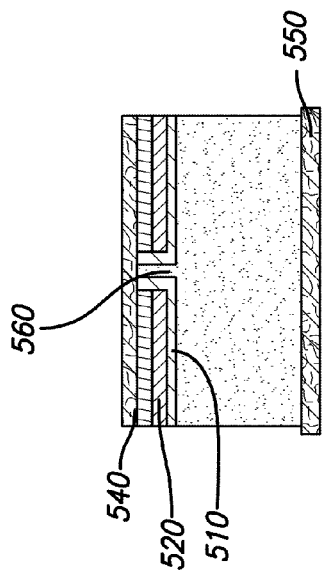

METHODS FOR FABRICATING SELF-ALIGNING SEMICONDUTOR HETEROSTRUCTURES USING SILICON NANOWIRES

CROSS REFERENCE TO RELATED APPLICATIONS

The present application claims priority to U.S. Provisional Application No. 61/262,843, filed on Nov. 19, 2009 which is incorporated herein by reference in its entirety. The present application may be related to U.S. patent application Ser. No. 12/712,097 for 'Methods for Fabricating High Aspect Ratio Probes and Deforming High Aspect Ratio Nanopillars and Micropillars' filed on Feb. 24, 2010, U.S. patent application Ser. No. 12/824,128 for 'Method for Fabricating Micro and Nanostructures in a Material' filed on Jun. 25, 2010, U.S. patent application Ser. No. 12/711,992 for 'Methods for Fabrication of High Aspect Ratio Micropillars and Nanopillars filed on Feb. 24, 2010, and U.S. patent application Ser. No. 12/822,109 for 'Methods for Fabricating Passivated Silicon Nanowires and Devices Thus Obtained' filed on Jun. 23, 2010, all of which are incorporated herein by reference in their entirety.

STATEMENT OF GOVERNMENT GRANT

This invention was made with government support under Grant No. HR0011-04-1-0054 awarded by the DARPA, Grant No. FA9550-04-1-0434 awarded by the AFOSR and Grant No. W911NF-07-1-0277 awarded by the ARO. The government has certain rights in the invention.

FIELD

The present disclosure relates to fabrication using silicon nanowires. Moreover, it relates to methods for fabricating self-aligning arrangements on semiconductors.

BACKGROUND

Defining high aspect ratio structures with controllable sidewalls in silicon has become increasingly important both in the nanometer and micrometer scale for solar cells, microelectronic devices, and chemical analysis. High aspect ratio micrometer pillars are used for solar cell investigations while nanometer scale high aspect ratio pillars are enabling fundamental investigations in theories of nanoscale pillar stress mechanics, silicon based lasers, and nanoscale electronic devices such as finFETs. Currently various nanofabrication techniques exist that rely on self assembly or bottom-up processing. Some top-down processing enabling reproducibility in nanofabrication can also be found.

Further applications are high surface area chemical sensors, mechanical oscillators and piezo-resistive sensors. High aspect ratio pillars with diameters between 50-100 nm could prove useful for core-shell type plasmonic resonators while pillars with sub-10 nm diameters have shown promising light emission characteristics.

SUMMARY

According to a first aspect, a method of fabricating self-aligning electronic components, the method comprising providing a substrate with one or more nanowires on a first side of the substrate and a first conductive layer on a second side of the substrate, coating the substrate and the one or more nanowires with an insulator, and cleaving the coated one or more nanowires to expose a selected length of a non-cleaved nanowire portion and a selected length of a non-cleaved insulator portion.

According to a second aspect, a method of fabricating self-aligning electronic components, the method comprising providing a substrate with one or more nanowires on a first side of the substrate and a first conductive layer on a second side of the substrate, coating the substrate and the one or more nanowires with an insulator, depositing a second conductive layer on the insulator, depositing a dielectric layer on the second conductive layer, and cleaving the coated one or more nanowires to expose a selected length of a non-cleaved nanowire portion and a selected length of a non-cleaved insulator portion.

According to a third aspect, a electronic arrangement comprising a semiconductor substrate, a cleaved semiconductor nanowire on the semiconductor substrate, and an oxide layer partially coating the cleaved semiconductor nanowire and coating the semiconductor substrate, wherein the oxide layer and the cleaved semiconductor nanowire define an uncoated region of the cleaved semiconductor nanowire, an epitaxial material on the uncoated region of the cleaved semiconductor nanowire.

According to a fourth aspect, an electronic arrangement comprising a semiconductor substrate, a cleaved semiconductor nanowire on the semiconductor substrate, an oxide layer partially coating the cleaved semiconductor nanowire and coating the semiconductor substrate, wherein the oxide layer and the cleaved semiconductor nanowire define an uncoated region of the cleaved semiconductor nanowires, a first conductive layer on the oxide layer, a dielectric material on the first conductive layer, and a second conductive layer on the cleaved semiconductor nanowire and the oxide layer.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 3A-3E show fabrication steps of growing a self-aligned heterostructure in accordance with an embodiment of the present disclosure. In particular:

FIG. 3A shows an exemplary cross-sectional view of a nanowire substrate.

FIG. 3B shows an exemplary cross-sectional view of an oxide passivated nanowire.

FIG. 3C shows an exemplary cross-sectional view of a nanostructure being mechanically cleaved.

FIG. 3D shows a cross-sectional view with epitaxial material deposited on the mechanically cleaved surface.

FIG. 3E shows a cross-sectional view with a conductive layer deposited on a topside and a backside on the substrate.

FIGS. 5A-5E show methods of fabricating a self-aligned transistor in accordance with an embodiment of the present disclosure. In particular:

FIG. 5A shows an exemplary cross-sectional view of an oxide passivated nanowire.

FIG. 5B shows an exemplary cross-sectional view of a substrate and the oxide passivated nanowire deposited with a conductive layer and a dielectric layer.

FIG. 5C shows an exemplary cross-sectional view of a nanostructure being mechanically cleaved.

FIG. 5D shows an exemplary cross-sectional view of deposition of a conductive layer on the cleaved nanostructure and substrate, and on the backside of the substrate.

FIG. 5E shows an exemplary cross-sectional view with the topside conductive layer etched back and a backside conductive layer.

DETAILED DESCRIPTION

Methods for fabrication of nanoscale electronic components are described in accordance with various embodiments of the present disclosure. Nanowires can be fabricated, by way of example and not of limitation, by performing standard photolithographic or electron-beam lithographic techniques, self-assembly to prepare masks for arrays, use of lithography to pattern catalysts and bottom-up techniques such as vapor-liquid-solid (VLS) growth instead of etching. For the sake of simplicity, throughout the present disclosure, the term 'nanopillar' intends to indicate a substantially upright nanoscale shaft where the height is much greater than the width (e.g., 5-10 times greater than the width) and can be used interchangeably with the term 'nanowire'. The term 'nanostructure' intends to indicate the nanopillar including any insulator or conductive layer(s) deposited thereon. 'Nanoscale' is defined herein to be any structure between 1 nm and 500 nm in width.

Figure 1:
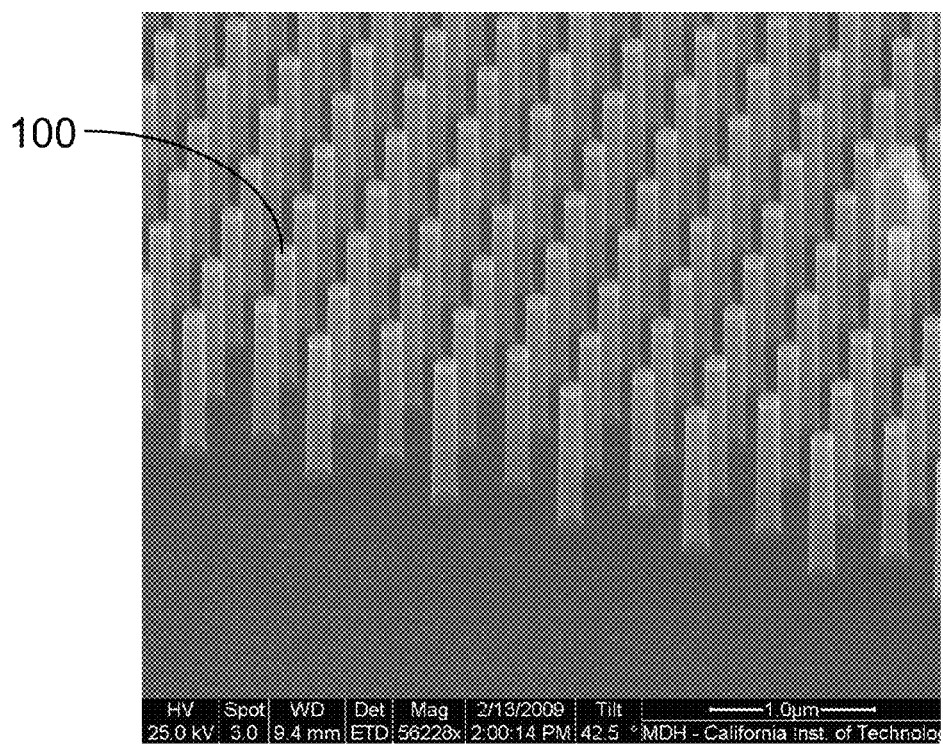
FIG. 1 shows an array of nanostructures.

Photolithography is a process used in microscale fabrication to selectively remove parts of a film or bulk of a substrate. It uses light to transfer a geometric pattern from a photo mask to a light-sensitive chemical called a photo resist on the substrate. Similarly, electron beam lithography is a process where a beam of electrons are scanned in a patterned fashion to the electron-beam resist. This is followed by a series of chemical treatments in a process similar to dark room processing for photography. The photo or electron-beam resists can be utilized as a mask directly, or utilized to pattern a harder mask which can have better resilience as compared to masking directly. Electron-beam resist can be utilized to fabricate a patterned aluminum oxide (alumina) mask, then removing the electron-beam resist and utilizing the patterned alumina during etching. Lithography and highly anisotropic etching enables routine fabrication of 30-50 nm nanostructures (100) in silicon with over 40:1 aspect ratios as shown in FIG. 1. Such structures can be further reduced in diameter by a subsequent thermal oxidation, wherein the oxidation process can be designed to self-terminate such that nanoscale pillars below 10 nm in width can be defined, allowing wide processing latitude.

Field effect transistors (FETs) are generally fabricated using a bottom-up method, planar to the substrate. In a bottom up method, the bottom-most layer is deposited first, followed by precise alignment of subsequent layers, one on top of another until a desired pattern is ultimately achieved. The final patterned arrangement becomes an electronic component, such as transistors (e.g, FETs, MOSFETs, etc). For example, FETs can be fabricated by lithography and the geometry of such FETs allow for charges to be conducted through a channel located below a gate, from source to drain. In such arrangement, the channel is located in-plane to the fabricated surface of the substrate, where the substrate can be a silicon wafer. When a bias is applied to the gate, current is electrostatically controlled between the source and the drain.

In recent applications, as shown for example in U.S. patent application Ser. No. 12/822,109 filed on Jun. 23, 2010, incorporated herein by reference in its entirety, vertical methods for fabricating such FETs are described. Controlling the oxidation process can produce strained silicon nanowires used in the fabrication of the FETs. In such vertical geometry, a nanowire is grown, oxidized, and the circumference is coated by a gate electrode.

FIGS. 3A-3E show various steps of fabricating a semiconductor arrangement involving a self-aligning heterostructure in accordance with the present disclosure. The term 'self-aligned' as used herein intends to indicate alignment that occurs automatically, without relying on an operator's skill or accuracy of a machine to accomplish the alignment. A person skilled in the art will understand that the number of steps involved is only indicative and that the process can occur in more or fewer steps according to the various embodiments.

FIG. 3A is a cross-sectional view of a patterned, or etched substrate (310) comprising a substantially vertical nanopillar (320). By way of example and not of limitation, the substrate (310) and the nanopillar (320) are made of silicon (Si). An example method of fabricating such nanopillars is described in U.S. patent application Ser. No. 12/824,128 filed on Jun. 25, 2010 and U.S. patent application Ser. No. 12/711,992 filed on Feb. 24, 2010, both incorporated herein by reference in their entirety. As an alternative to this embodiment, the vertical nanopillar can be fabricated on silicon-on-insulator (SOI) instead of bulk silicon structure.

FIG. 3B is a further cross-sectional view of the substrate (310) and the nanopillar (320) covered by an insulator, which can be an oxide layer (330), e.g., silicon dioxide ($SiO_2$) or other dielectric. The oxidation process can expand the silicon lattice by approximately 40% to incorporate oxygen. Such expansion leaves the adjacent un-oxidized portion of the silicon under tensile strain. In nanowires, such strain can cause the oxidation process to automatically stop, ultimately resulting in a stable nanoscale tensile-strained silicon core with a silicon dioxide shell. Exposing the embedded silicon to very high strain (e.g., 2.5-3.0%) enhances the ability of such device to efficiently emit light which can be utilized in, for example, opto-electronic switching.

U.S. patent application Ser. No. 12/822,109 filed on Jun. 23, 2010, also incorporated herein by reference in its entirety, describes methods to remove a portion of the oxide from the nanostructure to expose the silicon nanowire located below, by first protecting portions of the nanostructure and the oxide layer on the planar portion of the substrate with some dielectric material, e.g., photoresist, and then stripping away the oxide on the top end portion of the nanowire using methods such as etching.

An alternative method of exposing the nanostructure is shown as a cross-sectional view in FIG. 3C, by mechanically cleaving (340) or mechanically polishing a portion of the nanostructure (360) to reveal a previously unexposed non-removed portion (350) of the nanostructure. Mechanical cleaving results in a precise, clean cut of the nanostructure with minimal difficulty relative to the etching methods previously described.

Figure 4:
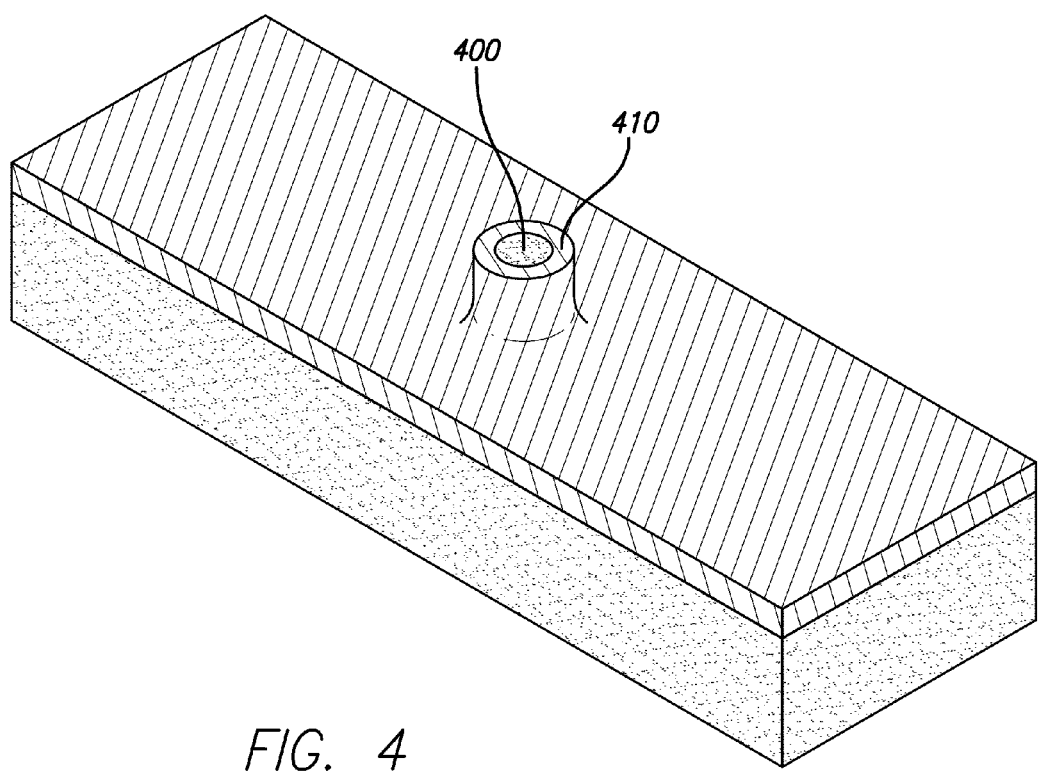
FIG. 4 shows an exemplary perspective view of a cleaved nanostructure on a substrate.

Once the nanostructure is cleaved, a single crystal current aperture (370) (400) surrounded by silicon dioxide (372) (410) is exposed, shown as a cross-sectional view in FIG. 3D and in a perspective view from the top in FIG. 4. Since the aperture is based on the diameter of the silicon nanowire, the aperture size is controlled by the lithographic pattern during the fabrication of the nanowire, and the temperature used during the oxidation process. By fabricating high aspect ratio nanostructures as described by way of example and not of limitation in U.S. patent application Ser. No. 12/711,992 filed on Feb. 24, 2010, U.S. patent application Ser. No. 12/712,097 filed on Feb. 24, 2010, and U.S. patent application Ser. No. 12/824,128 filed on Jun. 25, 2010, circular nano-apertures and sub-nano-apertures with diameters in the range of approximately 5 nm can be made. It is to be noted however, that the diameters are not limited to just the 5 nm range and can be larger or smaller.

Epitaxial material (374) (e.g., GaAs, InP, InAs, Ge, or other III-V material) can be grown precisely within the current apertures and on top of the clearly defined, cleaved silicon nanowire aperture surface as shown in FIG. 4 by exploiting the exposed clean silicon aperture (400) as a template for re-growing. Re-growing such epitaxial material on the aperture (400) involves layering of dissimilar lattice structure crystals in nanoscale environment, which ultimately creates quantum dots. For example, the crystal lattice of the nanowire substrate can be a silicon crystal and the re-grown quantum dot can be a GaAs crystal, one on top of another. However, such lattice structures can be grown without fear of defects in the lattice structure since the strain between the silicon and the re-growth material do not build up in the narrow nanoscale aperture. Thus, strain is kept to a minimum and the dimensions of the quantum dots are less than the pseudomorphic distance in any direction.

Accurate re-growing of quantum dots allow for precisely controlled light emission and electronic attributes. Additionally, simple definition of two and three terminal electrical and optoelectronic components can be accomplished on silicon substrates as shown in FIG. 3E.

FIG. 3E shows a cross-sectional view of the cleaved nanostructure with a quantum dot (392), which is then coated with a conductive layer (390) (e.g., gold, silver, copper, etc.). The backside of the substrate can also be coated with a conductive layer (380). Both conductive layers become contacts for the growth aperture arrangement.

The steps described from FIGS. 3A-3E describe methods of fabricating heterostructures on a substrate where the heterostructures are self-aligned. The term 'self-aligned' as used in the present disclosure intends to indicate alignment that occurs automatically, without relying on an operator's skill or preciseness of a machine to accomplish the alignment.

The present disclosure also describes methods for fabricating gate on a silicon nanostructure. However, the nanostructure is fabricated with tight control over gate length by initially fabricating the nanostructure to a length substantially taller than desired, then depositing a precisely controlled protective spacer layer, and subsequently cleaving or polishing the protruding portions of the nanostructure to obtain tightly controlled gate lengths. As a result, the need for precise manual alignment is eliminated as may be required in traditional lithography, thus resulting in gates which are self-aligned. Such fabrication is not limited to the fabrication of FETs but can also be applied to fabrication of other nano-arrangements, by way of example and not of limitation to, light emitting diodes (LEDs), detectors and junctions, on silicon.

FIGS. 5A-5E describe methods of fabricating a FET with self-aligning gates. Self-aligned FETs eliminate the need to rely on the skill of a person or a machine to precisely obtain proper alignment. FIG. 5A shows a cross-sectional view of an oxidized semiconductor nanowire (502), similar to FIG. 3B.

FIG. 5B shows a cross-sectional view of a nanostructure where a layer of conductive material (510) is deposited on the surfaces of the nanostructure and the substrate. The conductive layer material can be, by way of example and not of limitation, gold, silver, copper, aluminum or other types of metals. The conductive layer can be deposited by sputtering, whereby the operator can precisely control the thickness of the conductive layer being deposited. Controlling the thickness of the conductive layer can be accomplished with a higher degree of precision as compared to defining lithographic features at nanoscale levels. Therefore, arrangements with greater precision can be fabricated.

Figure 2A:
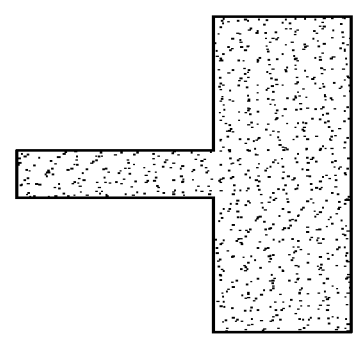
FIGS. 2A-2E shows a cross-sectional view of a nanostructure with an end portion of an oxide layer etched back.
Figure 2B:
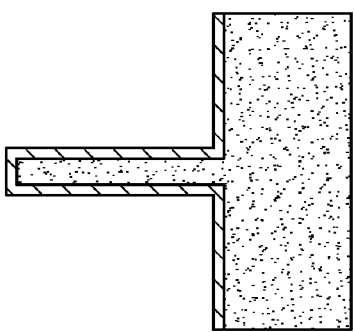
Figure 2C:
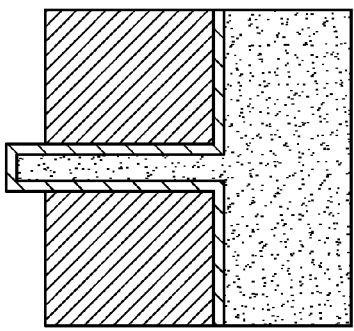
Figure 2D:
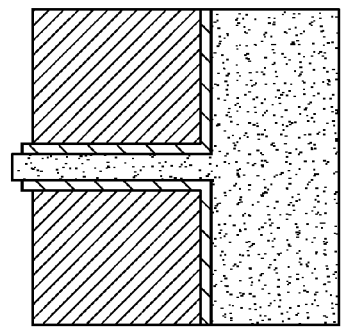
Figure 2E:
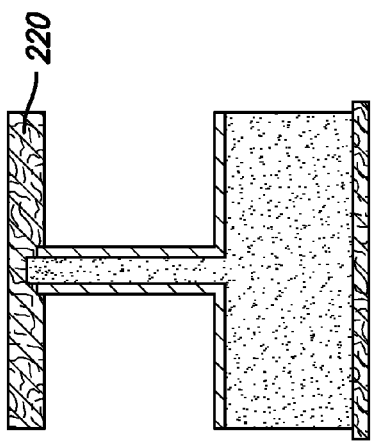

Contacts (220) (390) (570) in FIGS. 2E, 3E and 5E, respectively, are often made on the nanowires in order to make them into functional components. One such method for making contacts can be accomplished by air-bridging, whereby polymer (500) is used to planarize the nanowires before stripping off the top oxide (510) with hydrofluoric acid or selective dry etch.

Figure 6:
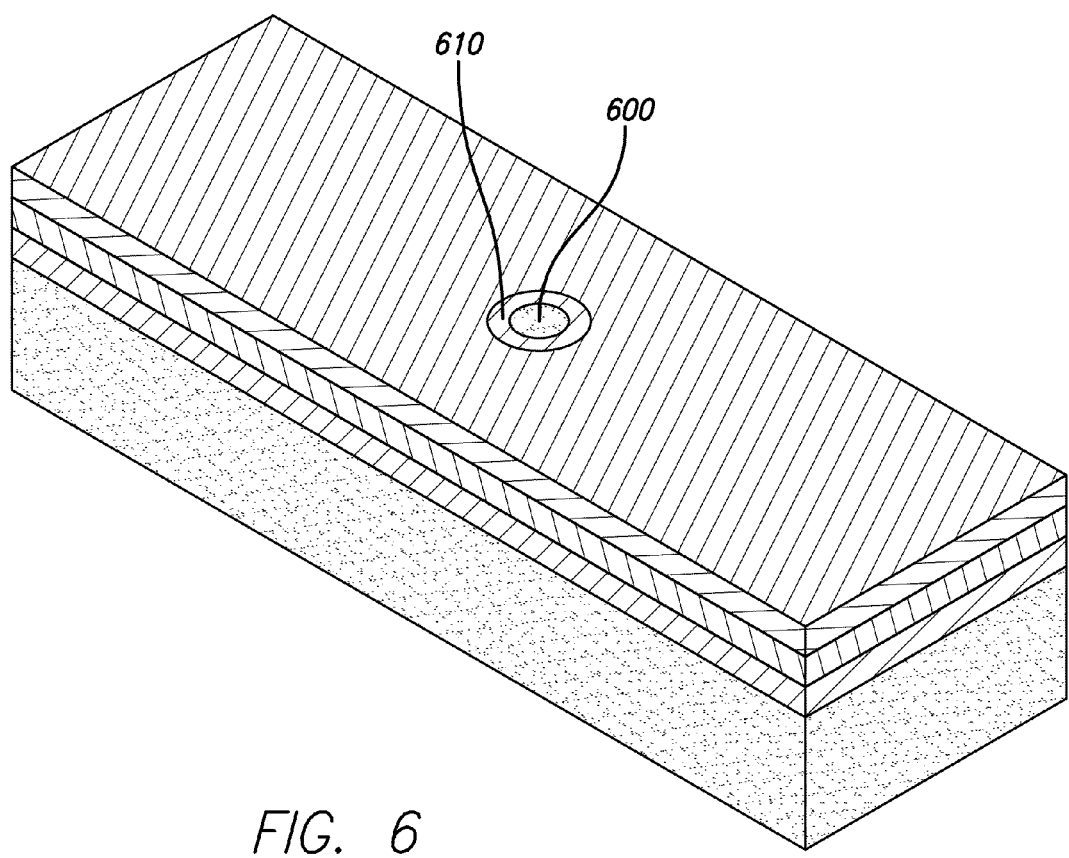
FIG. 6 shows an exemplary perspective view of a cleaved nanostructure on a substrate where the substrate is coated with a conductive and a dielectric layer.

In a further embodiment, the nanostructure is mechanically cleaved (530) as shown with a cross-sectional view in FIG. 5C. A dielectric layer (520) is deposited on the conductive layer (510) to protect the conductive layer (510) and to electrically isolate the conductive layer (510) from another conductive layer that will be deposited and described in the following paragraphs. Mechanically cleaving (530) the nanostructure just above the protective dielectric layer (520) removes a majority of the top portion of the nanostructure, leaving behind a small nanostructure (560) below the dielectric layer (520), thus exposing the remaining nanowire (600) with the insulator (610) completely surrounding the perimeter of the nanowire as show in FIG. 6 with a perspective top-view.

Cleaving the nanostructure cleaves the gate length of the arrangement, thus the gate length can be precisely fabricated with ease. The gate is essentially 'self-aligned' since the alignment process typically used in lithography is no longer required.

Finally in FIG. 5D, a second conductive layer (540) is deposited on the dielectric (520) and the remaining portion of the nanostructure (560). A backside contact layer (550) is also applied on the opposite side of the semiconductor substrate. The top conductive layer (540) is etched, such that the top conductive layer remains as contact points (570) above the nanostructure (560), as shown in FIG. 5E.

Such arrangement creates a metal-oxide-semiconductor (MOS) structure, which can be, but is not limited to a MOSFET. In case of a FET or a MOSFET, the top contact and the backside contacts become the source and drain, or the drain and source.

Although specific elements such as silicon, oxide, silicon oxide, etc were used to describe the various features and embodiments of the present disclosure, a person or ordinary skill in the art would understand that other elements can be used in place.

The examples set forth above are provided to give those of ordinary skill in the art a complete disclosure and description of how to make and use the embodiments of the methods for fabricating self-aligning arrangements on semiconductors of the disclosure, and are not intended to limit the scope of what the inventors regard as their disclosure. Modifications of the above-described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

We claim:

1. A method of fabricating self-aligning electronic components, the method comprising:

providing a substrate with one or more nanowires on and in contact with a first side of the substrate and a first conductive layer on and in contact with a second side of the substrate, wherein the one or more nanowires comprises at least one of a silicon-on-insulator or a bulk silicon structure;

substantially covering the substrate and the one or more nanowires with an insulator having thickness that is less than a height of the nanowire, the insulator contacting the one or more nanowires and the first side of the substrate;

cleaving the coated one or more nanowires to expose a selected length of a non-cleaved nanowire portion and a selected length of a non-cleaved insulator portion; and epitaxially depositing a quantum dot directly on the selected length of the non-cleaved nanowire portion.

2. The method of claim 1, further comprising depositing a second conductive layer on the substrate, the selected length of the non-cleaved nanowire portion, and the quantum dot.

3. The method of claim 2, wherein the substrate is a silicon substrate.

4. The method of claim 3, wherein the insulator is a silicon dioxide insulator.

5. The method of claim 4, wherein the cleaving is performed by mechanical polishing.

* * * * *